(12) United States Patent
Grebennikov et al.

(10) Patent No.: US 6,791,407 B2
(45) Date of Patent: Sep. 14, 2004

(54) SWITCHABLE POWER AMPLIFIER

(75) Inventors: Andrei Viktorovich Grebennikov, Co Cork (IE); Herbert Jaeger, Cork (IE); Eugene Heaney, Cork (IE)

(73) Assignee: Mia-Com Eurotec B.V., Blackrock Cork (IE)

( * ) Notice: Subject to any disclaimer, the term of this patent is extended or adjusted under 35 U.S.C. 154(b) by 0 days.

(21) Appl. No.: 10/047,543

(22) Filed: Jan. 15, 2002

(65) Prior Publication Data

US 2003/0132801 A1 Jul. 17, 2003

(51) Int. Cl.⁷ ................................................. H03G 9/00
(52) U.S. Cl. ..................... 330/133; 330/51; 330/124 R; 330/129; 330/302
(58) Field of Search ............................. 330/51, 124 R, 330/129, 133, 302

(56) References Cited

U.S. PATENT DOCUMENTS

| | | | |
|---|---|---|---|
| 3,919,656 A | | 11/1975 | Sokal et al. ................... 330/51 |
| 4,598,252 A | * | 7/1986 | Andricos ...................... 330/51 |
| 5,432,473 A | * | 7/1995 | Mattila et al. ............... 330/133 |
| 5,530,923 A | * | 6/1996 | Heinonen et al. ........... 455/126 |
| 5,661,434 A | * | 8/1997 | Brozovich et al. ............ 330/51 |
| 5,758,269 A | * | 5/1998 | Wu ............................. 455/127 |
| 5,834,975 A | * | 11/1998 | Bartlett et al. .............. 330/278 |
| 5,872,481 A | * | 2/1999 | Sevic et al. ................... 330/51 |
| 6,181,208 B1 | * | 1/2001 | King et al. .................. 330/295 |
| 6,255,906 B1 | * | 7/2001 | Eidson et al. ........... 330/124 R |
| 6,326,842 B1 | * | 12/2001 | Kuroda ....................... 330/133 |
| 6,326,849 B1 | * | 12/2001 | Wang et al. ................ 330/310 |
| 6,377,117 B2 | * | 4/2002 | Oskowsky et al. ........... 330/51 |
| 6,380,804 B1 | * | 4/2002 | Ross ........................... 330/51 |
| 2002/0021169 A1 | * | 2/2002 | King et al. .................... 330/51 |

OTHER PUBLICATIONS

V. B. Kozyrev, "Single–Ended Switching–Mode Tuned Power Amplifier with Filtering Circuit" (in Russian), Poluprovodnikovye pribory v tekhnike svyazi, vol. 6, pp. 152–166, 1971.

* cited by examiner

Primary Examiner—Michael Tokar
Assistant Examiner—Khai M. Nguyen

(57) ABSTRACT

A power amplifier having a first stage amplifier and a second stage amplifier, each stage of the power amplifier being configured in one of at least two power states based on a desired power output. When the first and second stages are configured in a first state, the power amplifier delivers efficient amplification in a first output power range and, when the first and second stages are configured in a second state, the power amplifier delivers efficient amplification in a second output power range. By configuring each stage in one of at least two states, a high level of power efficiency can be achieved for a broad range of power levels.

16 Claims, 3 Drawing Sheets

SWITCHABLE POWER AMPLIFIER

FIELD OF THE INVENTION

The present invention relates to amplifiers and, more particularly, to switchable power amplifiers having a high level of efficiency over a broad range of output power levels.

BACKGROUND OF THE INVENTION

Amplifiers such as transistors are commonly used to increase the strength of electrical signals. To increase the strength of an electrical signal, typically, the electrical signal is used to control a flow of energy from an energy source, e.g., a battery, through the amplifier to produce an output signal that varies in the same way as the electrical signal but has a larger amplitude. Generally, it is desirable to efficiently amplify the electrical signal using a minimal amount of power to reduce energy costs and increase battery life, for example.

The efficiency of an amplifier varies with operating conditions. For example, an amplifier designed for power efficiency at one output power level may be less efficient at another output power level. Many devices, such as wireless communication devices, require the amplifier to operate over a variety of output power levels. Typically, an amplifier is adjusted to achieve a peak efficiency at a single output power level, e.g., the maximum output power level. If the amplifier is designed for efficiency at the maximum output power level, the amplifier tends to operate less efficiently at lower output power levels. Accordingly, more energy will be consumed at lower output power levels than if the amplifier were designed for efficiency at the lower output power levels.

One technique for addressing efficient power amplification at more than one output power level is disclosed in U.S. Pat. No. 6,181,208 to King et. al., entitled Switchable Path Power Amplifier With Schotky Diode Combining Circuit, incorporated fully herein by reference. In U.S. Pat. No. 6,181,208, two separate power devices are employed. One power device is designed for efficiency at a first output power level and is used exclusively to deliver power for a first power output range and the other power device is designed for efficiency at a second output power level and is used exclusively to deliver power for a second power output range. The use of two power devices designed for efficiency at two different power levels in a mutually exclusive arrangement allows for increased efficiency across a broader range of power levels. However, using mutually exclusive power devices to achieve efficiencies at two different output power levels results in inefficiencies in terms of system components, since, at any given time, only one power device is being used.

Therefore, there is a need for an amplifier that efficiently delivers power at more than one output power level while efficiently utilizing system components. The present invention fulfills this need among others.

SUMMARY OF THE INVENTION

The present invention provides for an amplifier apparatus and method for efficiently amplifying electrical signals at two or more output power levels. The amplifier apparatus and method overcome the aforementioned problems by using a first stage amplifier that can be configured in at least two power states, a second stage amplifier that can be configured in at least two power states, and a state determination circuit for configuring the first and second stage amplifiers based on output power. To efficiently deliver power at one output power level, the circuit selectively configures the first and second stage amplifiers to each operate in one of their output power states. To efficiently deliver power at another output power level, the circuit selectively configures the first and second stage amplifiers to each operate at another of their output power states.

One aspect of the present invention is an amplifier including a first stage amplifier having at least two power states, the first stage amplifier having an input for receiving a signal, a control port, and an output; a second stage amplifier having at least two power states, the second stage amplifier having an input coupled to the output of the first stage amplifier, a control port, and an output; and a state determination circuit coupled to the control port of the first stage amplifier for selectively configuring the first stage amplifier in one of the at least two power states and further coupled to the control port of the second stage amplifier for selectively configuring the second stage amplifier in one of the at least two power states.

Another aspect of the invention is a method for amplifying a signal passing from a source to a load. The method includes determining an output power level of an amplifier, configuring a first stage amplifier of the amplifier in one of at least two states based on the determined power level to amplify the signal, and configuring a second stage amplifier of the amplifier in one of at least two states based on the determined power level to amplify the signal as amplified by the first stage amplifier.

DETAILED DESCRIPTION OF THE INVENTION

Figure 1:
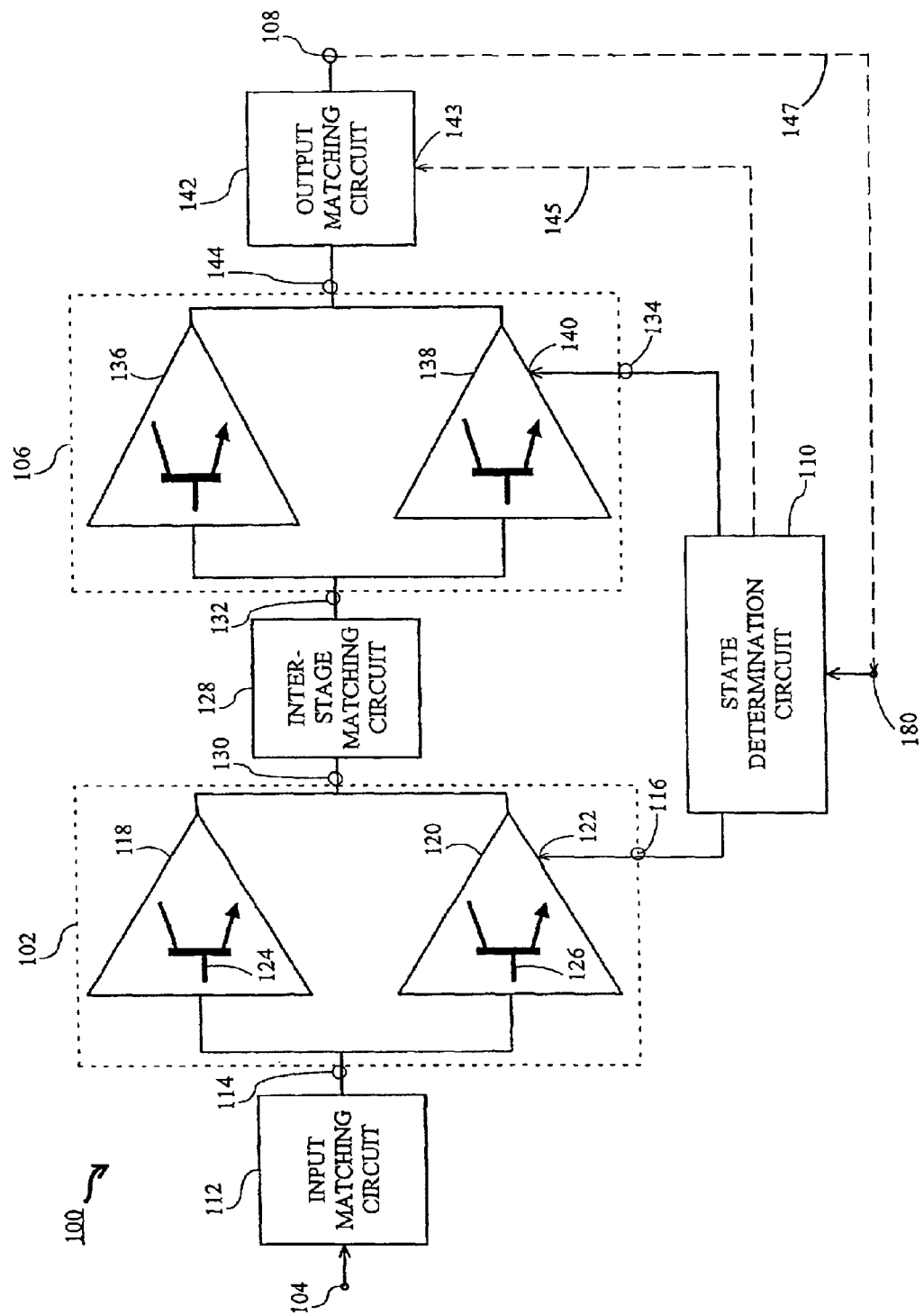
FIG. 1 is a schematic diagram of an amplifier in accordance with the present invention.

FIG. 1 depicts an amplifier 100 in accordance with one embodiment of the present invention. The amplifier 100 is particularly useful, but not exclusively so, for amplifying an electronic signal in the following devices: cellular phones, cordless phones, two way pagers, wireless LAN devices, and AM and FM analog transmitters. As will be appreciated by those of skill in the art, depending upon the complexity and/or cost of the device, the amplifier 100 may serve simply as a driver amplifier, or may be the complete amplifier for the device.

In a general overview of the illustrated embodiment, the amplifier 100 includes a first stage amplifier 102 having at least two power states for amplifying a signal received at an amplifier input port 104, a second stage amplifier 106 having at least two power states for amplifying the signal as amplified by the first stage amplifier to produce an amplified signal at an amplifier output port 108, and a state determination circuit 110 for configuring the states of the first and second stage amplifiers 102 and 106. The stage amplifiers 102 and 106 are designed to efficiently deliver power at one output power level of the amplifier 100 when each stage amplifier 102 and 106 is configured in one state and to efficiently deliver power at another output power level when each stage amplifier 102 and 106 is configured in another state.

The state determination circuit 110 of FIG. 1 selectively configures the two stage amplifiers 102 and 106 based on a criteria such as the output power level of the amplifier 100 at an amplifier output 108. By selectively configuring the two stage amplifiers 102 and 106 according to the amplifier's output power level, a high level of efficiency can be achieved across a broad range of output power levels. In one embodiment, the first and second stage amplifiers 102 and 106 are designed to operate together to efficiently deliver output power at two different output power levels. For example, the first and second stage amplifiers 102 and 106 may be designed such that, when each is configured in one of two states, they efficiently deliver output power at the amplifier's maximum output power level and, when each is configured in another of the two states, they efficiently deliver output power at the level the amplifier 100 is most likely to operate. In an alternative embodiment, the first and second stage amplifiers 102 and 106 may be designed such that each may be separately configured in one of several states to efficiently deliver output power at more that two output power levels. The amplifier 100 of FIG. 1 will now be described in detail.

Referring to FIG. 1, the first stage amplifier 102 amplifies a signal received at the input port 104 of the amplifier 100. The signal is received through the input matching circuit 112, which matches the impedance at an input 114 of the first stage amplifier 102 to the impedance of the source of the signal, described below in reference to FIGS. 2A–H and 3A–B. The first stage amplifier 102 can be configured in at least two states and the amount of amplification is dependent upon the state in which the first stage amplifier 102 is configured. The state of the first stage amplifier 102 may be configured by a configuration signal received at a control port 116 of the first stage amplifier 102. In the illustrated embodiment, the first stage amplifier 102 includes a first power device 118 and a second power device 120, and the state of the first stage amplifier 102 is determined by selectively enabling/disabling these power devices 118 and 120.

In one embodiment, the configuration signal enables/disables one of the power devices 118 or 120 to configure the first stage amplifier 102. For example, if the first power device 118 is enabled and the second power device 120 may be enabled/disabled via a control port 122, the first stage amplifier 102 can be configured in one state by enabling the second power device 120 so that both power devices 118 and 120 are enabled. Similarly, the first stage amplifier 102 can be configured in another state by disabling the second power device 120 so that only the first power device 118 is enabled. The first and second power devices 118 and 120 may each be enabled by applying a relatively high positive voltage, e.g., 2.7V, to the each of the power devices 118 and 120 and may be disabled by applying a relatively low voltage, e.g., 0.1V. The voltages may be applied to the power devices 118 and 120 directly, or indirectly via a known bias circuit for example. Various alternative methods for enabling/disabling the power devices 118 and 120 will be readily apparent to those skilled in the art and are considered within the spirit and scope of the present invention.

The actual implementation of the power devices 118 and 120 varies based upon the application, component cost, speed requirements, etc. In one embodiment, each power device 118 and 120 includes a transistor such as NPN transistors 124 and 126. Each power device 118 and 120 will further typically include DC bias circuitry that holds the transistors 124 and 126 in an initial state such that, under "normal" operating conditions, the input signal controls the output of the transistors 124 and 126, i.e., the transistors 124 and 126 are in an "active" region. The design and construction of various other suitable power devices 118 and 120 would be well known to those of skill in the art of electronics.

The second stage amplifier 106 amplifies the signal as amplified by the first stage amplifier 102. The signal as amplified by the first stage amplifier 102 is received through the interstage matching circuit 128, which matches the impedance at an output 130 of the first stage amplifier 102 to the input 132 of the second stage amplifier 106, described below in reference to FIGS. 2A–H and 3A–B. The second stage amplifier 106 can be configured in at least two states and the amount of amplification is dependent upon the state in which the second stage amplifier 106 is configured. The state of the second stage amplifier 106 is configured by a signal received at a control port 134 of the second stage amplifier 106. In the illustrated embodiment, the second stage amplifier 106 includes a third power device 136 and a fourth power device 138, and the state of second stage amplifier 106 is determined by selectively enabling/disabling these power devices 136 and 138.

As described above in reference to the first stage amplifier 102, the configuration signal may enable/disable one of the power devices 136 or 138 to configure the second stage amplifier 106. For example, if the third power device 136 is enabled and the fourth power device 138 may be enabled/disabled via a control port 140, the second stage amplifier 106 can be configured in one state by enabling the fourth power device 138 so that both power devices 136 and 138 are enabled and can be configured in another state by disabling the fourth power device 138 so that only the third power device 136 is enabled. The implementation of the power devices 136 and 138 may be as described above in reference to power devices 118 and 120.

In one embodiment, the first stage amplifier 102 and its states and the second stage amplifier 106 and its states are designed such that the first stage amplifier 102 and the second stage amplifier 106 operate efficiently together at a first output power level of the amplifier 100 when each are configured in a first state and operate efficiently together at a second output power level of the amplifier 100 when each are configured in a second state. The design and construction of multistage power amplifiers having power efficiency optimized for a certain power level is well known to those of skill in the art of electronics.

Figure 2A:
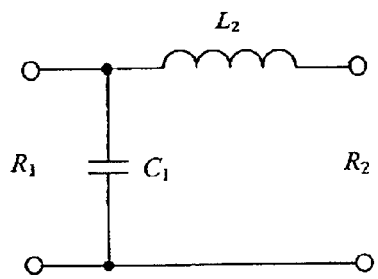
FIGS. 2A–H are circuit diagrams of suitable static impedance matching circuits for use in the amplifier of FIG. 1.
Figure 2B:
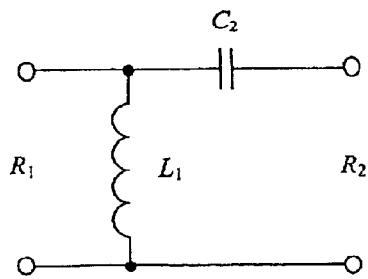
Figure 2C:
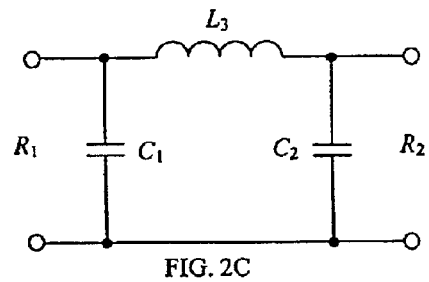
Figure 2D:
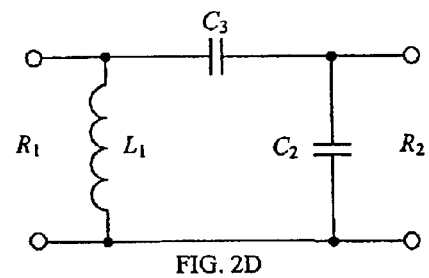
Figure 2E:
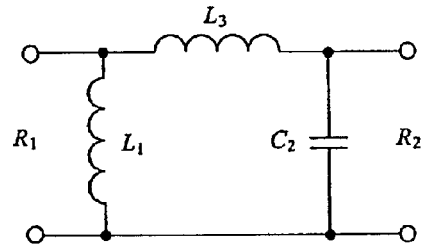

The input matching circuit 112, the interstage matching circuit 128, and the output matching circuit 142 match impedance levels between a signal source at an amplifier input 104 and the input 114 of the first stage amplifier 102, the output 130 of the first stage amplifier 102 and the input 132 of the second stage amplifier 106, and the output 144 of the second stage amplifier and a amplifier output 108 coupled to a load, respectively. If the ratio between the respective impedance levels are low, conventional low-pass and high-pass L-type static matching circuits including capacitors, C, and inductors, L, such as depicted in FIGS. 2A and 2B, respectively, may be used for the input, interstage, and/or output matching circuits 112, 128, and 142. The impedance coupled to one side of the matching circuit is represented by R1 and the impedance coupled to the other side of the matching circuit is represented by R2. The impedance ratio may then be represented by R1/R2.

For larger impedance ratios, static matching circuits that can be represented by π-type and T-type transformers may be used for impedance matching, such as depicted in FIGS.

Figure 2F:
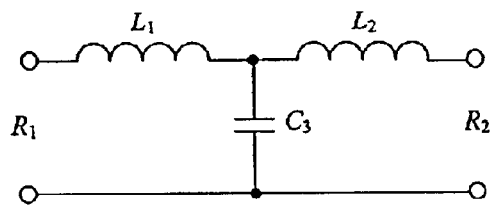
Figure 2G:
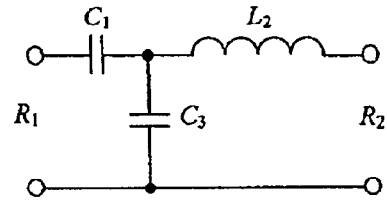
Figure 2H:
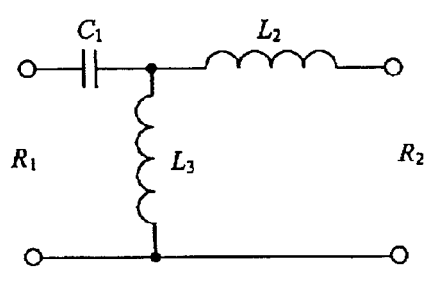

2C–2E (which show three different, well known π-type transformers) and FIGS. 2F–2H (which show three different, well known T-type transformers), respectively. For microwave, or similar high frequency signals, transmission lines may be substituted for the inductors of the circuits depicted in FIGS. 2A–H in a known manner. Various alternative circuits for matching impedance levels will be readily apparent to those skilled in the art and are considered within the spirit and scope of the present invention.

Figure 3A:
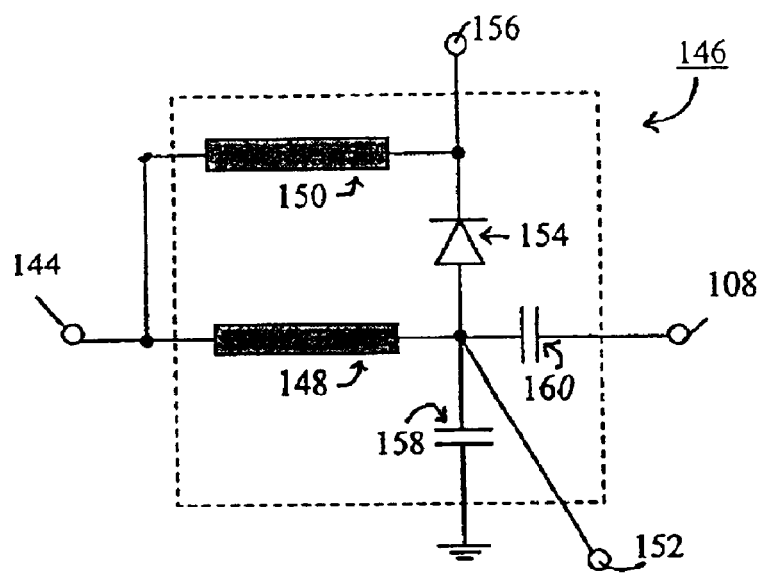
FIGS. 3A and 3B are circuit diagrams of suitable active output impedance matching circuits for use in the amplifier of FIG. 1.
Figure 3B:
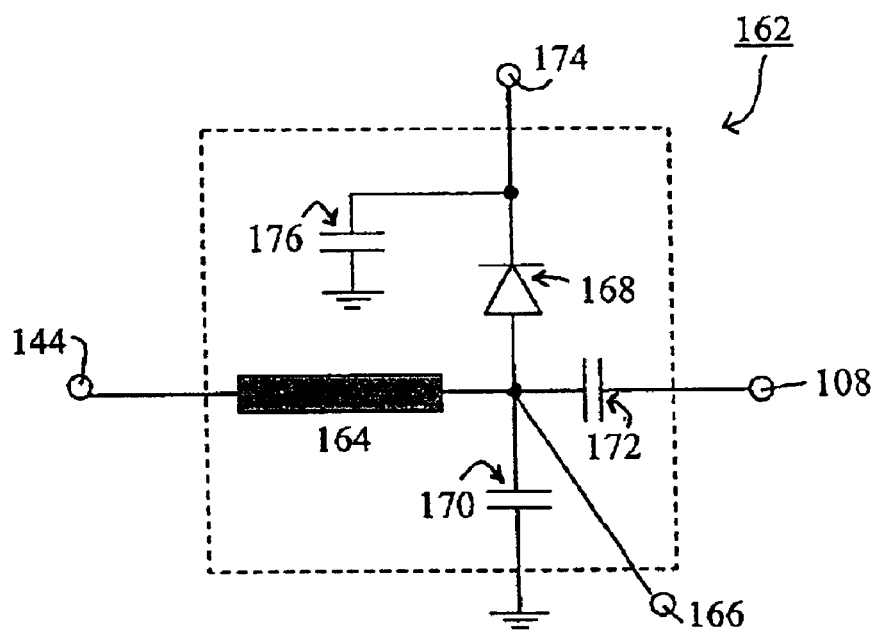

In an alternative embodiment, one or more of the matching circuits 112, 128, and 142, such as the illustrated output matching circuit 142, is a dynamic matching circuit that can be configured in at least two impedance level states, such as the matching circuits depicted in FIGS. 3A and 3B. The impedance level state of the output matching circuit 142 may be controlled by an impedance control signal 145 generated by the state determination circuit 110 and received at a control port 143 of the output matching circuit 142.

FIG. 3A depicts an active matching circuit 146 for use with the present invention that can be configured in two different states to match impedances for two different impedance ratios. The matching circuit 146 includes a first transmission line 148 and a second transmission line 150, each of which may be coupled to the output 144 of the second stage amplifier 106 (FIG. 1). One of the transmission lines 148 is coupled between the second stage amplifier's output 144 and the anode 152 of a diode 154 and the other transmission line 150 is coupled between the second stage amplifier's output 144 and the cathode 156 of the diode 154. The diode's anode 152 is coupled to ground through a first capacitor 158 and is coupled to an output 108 of the amplifier 100 (FIG. 1) through a second capacitor 160. The diode 154 may be a conventional p-i-n diode, which contains an intrinsic layer between p and n-type semiconductor layers.

In order to match higher impedance levels at the output 144 of the second stage amplifier 106 (FIG. 1) to the output 108 connected to a load, the diode 154 is turned off, thereby preventing current flow through the second transmission line 150 and increasing the impedance of the matching circuit 146. To match lower impedance levels at the output 144 of the second stage amplifer 106 (FIG. 1) to the output 108 connected to the load, the diode 154 is turned on, thereby allowing current to flow through the second transmission line 150 and decreasing the impedance of the matching circuit 146.

The control port 143 (FIG. 1) of the output matching circuit 142 may be used to selectively apply voltage across the diode 154 (FIG. 3A) to turn the diode off and on based on the impedance control signal 145 (FIG. 1) received from the state determination circuit 110, for example. To turn the diode 154 off, a relatively high voltage, e.g., 2.7V, is applied to the cathode 156 of the diode 154 and a relatively low voltage, e.g., 0.1V, is applied to the anode 152 of the diode 154 in a known manner. Likewise, to turn the diode 154 on, a relatively low voltage is applied to the cathode 156 and a relatively high voltage is applied to the anode 152 of the diode 154.

FIG. 3B depicts an alternative dynamic matching circuit 162. The matching circuit 162 includes a single transmission line 164 coupled to the output 144 of the second stage amplifier 106 (FIG. 1). The transmission line 164 is coupled between the output 144 of the second stage amplifier 106 and an anode 166 of a diode 168. The anode 166 of the diode 168 is coupled to ground through a first capacitor 170 and to an output 108 of the amplifier 100 (FIG. 1) through a second capacitor 172. A cathode 174 of the diode 168 is coupled to ground through a third capacitor 176.

To increase the impedance of the matching circuit 162, the diode 168 is turned off as described above in reference to the diode 154 of FIG. 3A, thereby preventing current flow through the third capacitor 176. To decrease the impedance of the matching circuit 162, the diode 168 is turned on as described above in reference to the diode 154 of FIG. 3A, thereby allowing current to flow through the third capacitor 176.

Variations to the dynamic matching circuits 146 and 162 depicted in FIGS. 3A and 3B that are made obvious in light of the present application are considered within the spirit and scope of the present invention.

Referring once again to FIG. 1, the state determination circuit 110 is operable to configure the power level of the amplifier 100 by selectively configuring the first and second stage amplifiers 102 and 106. In addition, the state determination circuit 110 may also selectively configure the output matching circuit 142 if an active output matching circuit is used, such as depicted in FIGS. 3A and 3B. The state determination circuit 110 may receive an information signal 147 at an instruction port 180 that may be used by the state determination circuit 110 to selectively configure the first stage amplifier 102, the second stage amplifier 106, and, optionally, the output matching circuit 142 to configure the power level of the amplifier 100. The information signal 147, for instance, may be the present output power level from the output 108 of the amplifier 110, as illustrated in FIG. 1.

In the illustrated embodiment, the state determination circuit 110 is coupled to the control port 116 of the first stage amplifier 102, the control port 134 of the second stage amplifier 106, and the control port 143 of the output matching circuit 142. More particularly, the state determination circuit 110 is coupled to the control port 122 of the second power device 120 and the control port 140 of the fourth power device 138 for selectively enabling/disabling those devices 120 and 138, respectively, and is coupled to the control port 143 of the output matching circuit 142 for selectively configuring its impedance level state. In addition, the state determination circuit 110 is coupled to the output 108 of the amplifier 100 to receive an information signal 147 for use in selectively configuring the first stage amplifier 102, the second stage amplifier 106, and the output matching circuit 142.

In one embodiment, the second power device 120 and the fourth power device 138 can be selectively enabled/disabled by the state determination circuit 110. In this particular embodiment, the first power device 118 and the third power device 136 are always enabled during the "normal" operation of the amplifier 100. To configure the amplifier 100 in a first power level, the state determination circuit 110 enables the second power device 120 and the fourth power device 138 so that the first, second, third, and fourth power devices 118, 120, 136, and 138 are all enabled, thereby providing the maximum power amplification for the amplifier 100. To configure the amplifier 100 in a second power level, the state determination circuit 110 disables the second and fourth power devices 120 and 138 so that only the first and third power devices 118 and 136 are enabled, thereby providing power amplification below the maximum power amplification of the amplifier 100. The state determination circuit 110 may enable the second and fourth power devices 120 and 138 as described above by applying a relatively high voltage, e.g., 2.7V, to the power devices 120 and 138 and disable the power devices 120 and 138 by applying a relatively low voltage, e.g., 0.1V.

In an alternative embodiment, the state determination circuit 110 may be coupled to all of the power devices 118, 120, 136, and 138 to provide additional possible configurations. The power level of the amplifier 100 may then be configured by selectively enabling/disabling the power devices 118, 120, 136, and 138 in various combinations. For example, one power level of the amplifier 100 may be obtained by enabling the first, third, and fourth power devices 118, 136, and 138 so that only the second power device 120 is disabled. Likewise all power devices 118, 120, 136, and 138 may be disabled by the state determination circuit 110 when the amplifier 100 is inactive. Various similar embodiments will be readily apparent to those skilled in the art and are considered within the spirit and scope of the present invention.

The state determination circuit 110 may configure the output matching circuit 142 by selectively applying voltage to the output matching circuit 142. For example, to configure the output matching circuit 146 depicted in FIG. 3A in a relatively high impedance state, the state determination circuit 110 causes a relatively high voltage, e.g., 2.7V, to be applied to the cathode 156 of the diode 154 and a relatively low voltage, e.g., 0.1V, to be applied to the anode 152 of the diode 154. Likewise, to configure the output matching circuit 146 in a low impedance state, the state determination circuit 110 causes a relatively low voltage to be applied to the cathode 156 of the diode 154 and a relatively high voltage level to be applied to the anode 152 of the diode 154. As will be apparent to those skilled in the art, the output matching circuit 162 depicted in FIG. 3B may be controlled in a similar manner.

The state determination circuit 110 (FIG. 1) selectively configures the first stage amplifier 102, the second stage amplifier 106, and, optionally, the output matching circuit 142 based on predefined criteria such as the output power of the amplifier 100 during normal operation. For example, the state determination circuit 110 could be designed to selectively configure the amplifier 100 at one power level if the output power of the amplifier 100 is in a certain range, e.g., near the maximum output power of the amplifier 100, and to configure the amplifier 100 at another power level if the output power of the amplifier 100 is in another range, e.g., somewhere below the maximum output power of the amplifier 100.

The output matching circuit 142 may also be configured by the state determination circuit 110 based on the output power of the amplifier 100. For example, at relatively low output power conditions, the impedance at the output 144 of the second stage amplifier 106 will be relatively high. Therefore, the matching circuit 142 will be configured with a relatively high impedance. At relatively high output power conditions, on the other hand, the impedance at the output 144 of the second stage 106 will be relatively low. Therefore, the matching circuit 142 will be configured with a relatively low impedance.

In one embodiment, if the amplifier 100 is used in a wireless device that communicates with a base station, the base station with which the wireless device is in communication may send to the wireless device a signal indicating the strength of a signal received by the base station from the wireless device. The signal strength indicator may be used by the wireless device to set the output power of the wireless device, which, in turn, may be used to configure the amplifier 100. The output power of the wireless device may be set to operate at a low output power when high output power is not needed, thereby conserving energy. For example, if the wireless device is near the base station and the base station is receiving a strong signal from the wireless device, the base station may send a signal to the wireless device that the wireless device may use to set the wireless device to operate at low output power, which, in turn configures the amplifier 100 via the state determination circuit 110 at a low output power level, thereby conserving energy. Likewise, if the wireless device is farther from the base station and the base station is receiving a weak signal from the wireless device, the base station may send a signal to the wireless device that may be used to set the wireless device to operate at high output power, which, in turn, configures the amplifier 100 at a high output power level, thereby sending a stronger signal.

The state determination circuit 110 may include a digital signal processor, a microcontroller, a power level sensor, programmable logic such as PLD or PAL, and/or other suitable circuitry. For example, when the amplifier 100 is part of a CDMA cellular telephone system, a microcontroller typically operates the system, controlling, among other things, the output power level. Alternatively, the state determination circuit 110 may be a power level sensor coupled to the power amplifier output 108 for directly measuring the output power level. In certain embodiments, the state determination circuit 110 includes both a digital processor and a power level sensor circuit, and the state determination is based upon the direct measurement of output power level and other information available to the digital processor.

In accordance with certain embodiments of the amplifier 100, the first stage amplifier 102, the second stage amplifier 106, and the impedance matching circuits 112, 128, and 142 are formed on a single device. This single device is formed within a single integrated circuit package. Alternatively, these components could be packaged separately, and then wired together on some suitable mechanism such as a printed circuit board.

Utilization of stage amplifiers having multiple states designed for power efficient operation at different output power levels was described above. However, the stage amplifiers could be designed for power efficient operation corresponding to other operating conditions such as signal waveform (e.g., digital versus analog), ambient temperature, power supply waveform, etc. In these embodiments, the state determination circuit 110 would configure the amplifier stages based on power efficiencies for selected ones of these operating conditions. Likewise, it is contemplated that the stage amplifiers could be optimized for other purposes, such as linearity in a certain operating range, and then the state determination circuit 110 would configure the stage amplifiers in the best states based on criteria including something other than power efficiency, e.g., linearity.

Having thus described a few particular embodiments of the invention, various alterations, modifications, and improvements will readily occur to those skilled in the art. For example, in the illustrated embodiment, two amplifier stages are used with each stage having two power states. However, it is contemplated that more than two stages and/or more than two states per stage may be utilized. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. An amplifier comprising:

a first stage having at least two power states comprising a first power device and a second power device connected in parallel with said first power device, said first stage having an input for receiving a data signal, a control port, and an output;

a second stage having at least two power states comprising a third power device and a fourth power device connected in parallel with said third power device, said third power device and said fourth power device each having an output, said second stage having an input coupled to the output of said first stage, a control port, and a second stage output comprising a combination of said outputs of said third power device and said fourth power device;

an output impedance matching circuit having at least two impedance matching states, said output impedance matching circuit having an input coupled to the second stage output, a control port, and an output for coupling to a load; and a state determination circuit coupled to the control port of said first stage for selectively configuring said first stage in one of the at least two power states and further coupled to the control port of said second stage for selectively configuring said second stage in one of the at least two power states and further coupled to the control port of the output impedance matching circuit for selectively configuring said output impedance matching circuit in one of the at least two impedance matching states.

2. The amplifier of claim 1, wherein said state determination circuit selectively configures said first stage, said second stage, and said output impedance matching circuit such that said amplifier operates at a first power level when an output power level is within a first range and a second power level when the output power level is within a second range.

3. The amplifier of claim 1, wherein said state determination circuit selectively configures said first stage by selectively enabling said second power device, said first stage being in a first of the at least two power states when said first and second power devices are enabled and being in a second of the at least two power states when said first power device is enabled and said second power device is not enabled; and wherein said state determination circuit selectively configures said second stage by selectively enabling said fourth power device, said second stage being in a first of the at least two power states when said third and fourth power devices are enabled and being in a second of the at least two power states when said third power device is enabled and said fourth power device is not enabled.

4. The amplifier of claim 3, wherein:

said at least two power states of said first stage consists of said first and second of the at least two power states of said first stage;

said at least two power states of said second stage consists of said first and second of the at least two power states of said second stage; and said amplifier is in a first power level when said first and second stages are in said first of their at least two power states and is in a second power level when said first and second stages are in said second of their at least two power states.

5. The amplifier of claim 1, wherein said first, second, third, and fourth power devices are transistors.

6. The amplifier of claim 1, further comprising an interstage impedance matching circuit coupled between the output of said first stage and the input of said second stage.

7. The amplifier of claim 1, further comprising an input stage impedance matching circuit coupled to the input of said first stage, said signal being received through said input stage matching circuit.

8. The amplifier of claim 1, wherein said output impedance matching circuit comprises:

a first transmission line having a first end coupled to the output of said second stage and further having a second end;

a second transmission line having a first end coupled to the output of said second stage and further having a second end; and a diode having an anode coupled to the second end of said first transmission line and a cathode coupled to the second end of said second transmission line.

9. The amplifier of claim 1, wherein said output impedance matching circuit comprises:

a transmission line having a first end coupled to the output of said second stage and further having a second end;

a capacitor having a first end coupled to ground and further having a second end; and a diode having an anode coupled to the second end of said transmission line and a cathode coupled to the second end of said capacitor.

10. A wireless device including an amplifier, said wireless device capable of establishing communication with a base station, said amplifier comprising:

a first stage having at least two power states comprising a first power device and a second power device connected in parallel with said first power device, said first stage having an input for receiving a data signal, a control port, and an output;

a second stage having at least two power states comprising a third power device and a fourth power device connected in parallel with said third power device, said third power device and said fourth power device each having an output, said second stage having an input coupled to the output of said first stage, a control port, and a second stage output comprising a combination of said outputs of said third power device and said fourth power device capable of passing said signal as amplified by said first and second stages;

an output circuit having at least two impedance matching states, said output circuit having an input coupled to the second stage output of, a control port, and an output for coupling to a load; and a state determination circuit coupled to the control port of said first stage for selectively configuring said first stage in one of the at least two power states, coupled to the control port of said second stage for selectively configuring said second stage in one of the at least two power states, and coupled to the control port of said output circuit for selectively configuring said output circuit in one of the at least two impedance matching states.

11. The amplifier of claim 10, wherein when said state determination circuit configures said first stage in a first of the at least two power states, said second stage in a first of the at least two power states, and said output circuit in a first of the at least two impedance matching states, said amplifier operates at a first power efficiency level; and wherein when said state determination circuit configures said first stage in a second of the at least two power states, said second stage in a second of the at least two power states, and said output circuit in a second of the at least two impedance matching states, said amplifier operates at a second power efficiency level.

12. The amplifier of claim 11, wherein said state determination circuit selectively configures said first stage, said second stage, and said output circuit based on a signal strength indicator signal generated by the base station.

13. The amplifier of claim 11 wherein said state determination circuit selectively configures said first stage by selectively enabling said second power device, said first stage being in one of the at least two power states when said first and second power devices are enabled and being in another of the at least two power states when said first power device is enabled and said second power device is not enabled; and wherein said state determination circuit selectively configures said second stage by selectively enabling said fourth power device, said second stage being in one of the at least two power states when said third and fourth power devices are enabled and being in another of the at least two power states when said third power device is enabled and said fourth power device is not enabled.

14. A method for amplifying a signal passing from a source to a load, said method comprising the steps of;

determining an output power level of an amplifier;

configuring a first stage amplifier of the amplifier in one of at least two states based on said determined output power level, said first stage amplifier amplifying said signal; and configuring a second stage amplifier of the amplifier in one of at least two states based on said determined output power level, said second stage amplifier amplifying said signal as amplified by said first stage amplifier, configuring an output matching circuit in one of at least two impedance states based on said determined level, said output matching circuit matching the impedance of said second stage amplifier and the impedance of the load.

15. The method of claim 14, wherein said step of configuring said first stage amplifier comprises the steps of:

enabling a first power device of said first stage amplifier when said power level is within a first output power range, said first stage amplifier comprising at least said first power device and an enabled second power device, such that said first power device and said second power device are both enabled; and disabling said first power device when said power level is within a second output power range, such that only said second power device is enabled.

16. The method of claim 14, wherein said step of configuring said second stage amplifier stage comprises the steps of:

enabling a third power device of said second stage amplifier when said power level is within said first output power range, said second stage amplifier comprising at least said third power device and an enabled fourth power device, such that said third power device and said fourth power device are both enabled; and disabling said third power device when said power level is within said second output power range, such that only said fourth power device is enabled.

* * * * *